United States Patent
Ye et al.

(10) Patent No.: US 6,529,045 B2
(45) Date of Patent: *Mar. 4, 2003

(54) NMOS PRECHARGE DOMINO LOGIC

(75) Inventors: Yibin Ye, Portland, OR (US); Reed D. Spotten, Hillsboro, OR (US); Vivek K. De, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/406,938

(22) Filed: Sep. 28, 1999

(65) Prior Publication Data

US 2002/0057112 A1 May 16, 2002

(51) Int. Cl.⁷ .............................................. H03K 19/096
(52) U.S. Cl. ............................ 326/95; 326/98; 326/121
(58) Field of Search .............................. 326/95, 98, 93, 326/121

(56) References Cited

U.S. PATENT DOCUMENTS

| | | | |
|---|---|---|---|
| 4,571,510 A | 2/1986 | Seki et al. | 307/449 |
| 4,697,109 A | 9/1987 | Honma et al. | 307/475 |

(List continued on next page.)

FOREIGN PATENT DOCUMENTS

| | | | |
|---|---|---|---|
| EP | 0954101 A2 | * 11/1999 | |
| JP | 59-039124 | 3/1984 | ....... H03K/019/096 |
| JP | 4239221 A | * 8/1992 | |

OTHER PUBLICATIONS

Bryant, R. E., "Graph–Based Algorithms for Boolean Function Manipulation", *IEEE Transactions on Computers*, C–35 (8), pp. 677–691, (1986).

Chakradhar, S. T., et al., "An Exact Algorithm for Selecting Partial Scan Flip–Flops", *Proceedings of the 31st Design Automation Conference*, San Diego, California, pp. 81–86, (1994).

Chakravarty, S., "On the Complexity of Using BDDs for the Synthesis and Analysis of Boolean Circuits", *27th Annual Allerton Conference on Communication, Control, and Computing*, Allerton House, Monticello, Illinois, pp. 730–739, (1989).

Patra, P., et al., "Automated Phase Assignment for the Synthesis of Low Power Domino Circuits", *Proceedings of the 36th ACM/IEEE Conference on Design Automation*, pp. 379–384, (1999).

(List continued on next page.)

*Primary Examiner*—Daniel D. Chang
(74) *Attorney, Agent, or Firm*—Schwegman, Lundberg, Woessner & Kluth, P.A.

(57) ABSTRACT

A domino logic circuit is provided. The circuit includes an n-channel clock transistor coupled between a dynamic output node and a high voltage connection, with the gate of the clock transistor coupled to receive an inverse clock signal. A first inverter and a second inverter are connected in series such that the input of the first inverter is connected to the output of the second inverter. The input of the second inverter is connected to the dynamic output node. An n-channel level keeper transistor is connected between the dynamic output node and the high voltage connection, and the gate of the level keeper transistor is connected to the output of the first inverter. A pull-down circuit is connected between the dynamic output node and a low-voltage connection.

16 Claims, 2 Drawing Sheets

U.S. PATENT DOCUMENTS

| | | | |
|---|---|---|---|
| 4,899,066 A | | 2/1990 | Aikawa et al. ............. 307/45.2 |
| 5,115,150 A | | 5/1992 | Ludwig ....................... 307/475 |
| 5,258,666 A | | 11/1993 | Furuki ......................... 307/449 |
| 5,453,708 A | | 9/1995 | Gupta et al. ................... 326/98 |
| 5,543,735 A | * | 8/1996 | Lo ................................ 326/93 |
| 5,568,062 A | * | 10/1996 | Kaplinsky ..................... 326/27 |
| 5,657,256 A | | 8/1997 | Swanson et al. ............. 364/580 |
| 5,661,675 A | | 8/1997 | Chin et al. ................... 364/768 |
| 5,671,151 A | | 9/1997 | Williams ..................... 364/489 |
| 5,731,983 A | | 3/1998 | Balakrishnan et al. ...... 364/489 |
| 5,748,012 A | * | 5/1998 | Beakes et al. ................. 326/93 |
| 5,796,282 A | | 8/1998 | Sprague et al. ............. 327/210 |
| 5,815,005 A | | 9/1998 | Bosshart ....................... 326/95 |
| 5,825,208 A | | 10/1998 | Levy et al. .................... 326/98 |
| 5,831,990 A | | 11/1998 | Queen et al. ............... 371/22.1 |
| 5,852,373 A | | 12/1998 | Chu et al. ...................... 326/98 |
| 5,886,540 A | | 3/1999 | Perez ............................ 326/93 |
| 5,889,417 A | | 3/1999 | Klass et al. ................... 326/98 |
| 5,892,372 A | | 4/1999 | Ciraula et al. ................ 326/96 |
| 5,896,046 A | | 4/1999 | Bjorksten et al. ............. 326/98 |
| 5,896,399 A | * | 4/1999 | Lattimore et al. ......... 371/21.4 |
| 5,898,330 A | | 4/1999 | Klass ........................... 327/210 |
| 5,917,355 A | | 6/1999 | Klass ........................... 327/208 |
| 5,942,917 A | | 8/1999 | Chappell et al. ............ 326/121 |
| 6,002,272 A | * | 12/1999 | Allen et al. ................. 327/379 |
| 6,049,231 A | | 4/2000 | Bosshart ....................... 326/98 |
| 6,052,008 A | * | 4/2000 | Chu et al. .................... 327/200 |
| 6,060,910 A | * | 5/2000 | Inui ............................. 326/98 |
| 6,086,619 A | | 7/2000 | Hausman et al. .............. 703/6 |
| 6,087,855 A | | 7/2000 | Frederick, Jr. et al. ...... 326/106 |
| 6,090,153 A | | 7/2000 | Chen et al. ..................... 716/8 |
| 6,104,212 A | | 8/2000 | Curran ......................... 326/95 |
| 6,108,805 A | | 8/2000 | Rajsuman ................... 714/724 |
| 6,132,969 A | | 10/2000 | Stoughton et al. ............. 435/6 |
| 6,133,759 A | | 10/2000 | Beck et al. .................... 326/98 |
| 6,204,696 B1 | * | 3/2001 | Krishnamuthy et al. ...... 326/98 |
| 2001/0014875 A1 | | 8/2001 | Young et al. ................. 705/37 |

OTHER PUBLICATIONS

Puri, R., et al., "Logic Optimization by Output Phase Assignment in Dynamic Logic Synthesis", *International Conference on Computer Aided Design*, 7 p., (1996).

Thompson, S., et al., "Dual Threshold Voltages and Substrate Bias: Keys to High Performance, Low Power, 0.1 um Logic Designs", *1997 Symposium on VLSI Technology Digest of Technical Papers*, pp. 69–70, (1997).

Xun, L., et al., "Minimizing Sensitivity to Delay Variation in High–Performance Synchronous Circuits", *Proceedings of the Design, Automation and Test in Europe Conference*, Munich, Germany, (Mar. 9–12, 1999), 643–649.

* cited by examiner

NMOS PRECHARGE DOMINO LOGIC

FIELD OF THE INVENTION

The invention relates generally to semiconductor logic devices, and more specifically to domino logic circuitry having a novel NMOS precharge gate.

BACKGROUND OF THE INVENTION

Semiconductor operational frequencies are ever increasing, requiring circuitry and processes that support these faster clock rates. Domino circuits have been used in such circuits to speed processing, due to the way in which a domino logic circuit handles data. A typical domino logic circuit receives data on a first transition of a clock, and couples a logically derived signal to external circuitry on a next transition of the clock.

A conventional domino circuit includes dynamic circuitry coupled to static gate circuitry. The dynamic circuitry precharges an input of the static circuitry when a clock signal is low, and couples an input data signal to the static circuitry when the clock signal is high. The dynamic circuitry often is n-type metal oxide semiconductor (NMOS) pull-down circuitry, that is operable to pull down the level of a relatively weakly held pre-charged circuit node. The node is then latched in static CMOS circuitry to provide a stable output until the next logical cycle.

But, the speed of such logic is limited by the time it takes to pre-charge the dynamic circuit node that provides the data signal to the static CMOS latch, and by the time it takes to pull down the weakly-held precharged node voltage to provide a low signal level to the latch. For these reasons and others that will be apparent to those skilled in the art upon reading and understanding this specification, a need exists for a domino logic circuit that reduces the time required to operate the dynamic pre-charge portion of a domino logic circuit.

SUMMARY OF THE INVENTION

A domino logic circuit is provided. The circuit includes an n-channel clock transistor coupled between a dynamic output node and a high voltage connection, the gate of the clock transistor further coupled to receive an inverse clock signal. A first inverter and a second inverter are connected in series such that the input of the first inverter is connected to the output of the second inverter. The input of the second inverter is connected to the dynamic output node. An n-channel level keeper transistor is connected between the dynamic output node and the high voltage connection, and the gate of the level keeper transistor is connected to the output of the first inverter. A pull-down circuit is connected between the dynamic output node and a low-voltage connection.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because domino logic circuits are utilized as a high-speed method of implementing digital logic, a need exists for domino logic that provides for the fastest operational speed as can practically be achieved. This can be achieved by modifying a domino logic circuit to change state more quickly, such as by decreasing the voltage swing needed to change states.

The present invention provides an improved domino logic circuit that reduces the time required to change states of the dynamic pre-charge portion of a domino logic circuit. This invention provides faster operation than traditional domino logic implemented via the same fabrication process, and therefore offers desirable improvement over the prior art.

Figure 1:
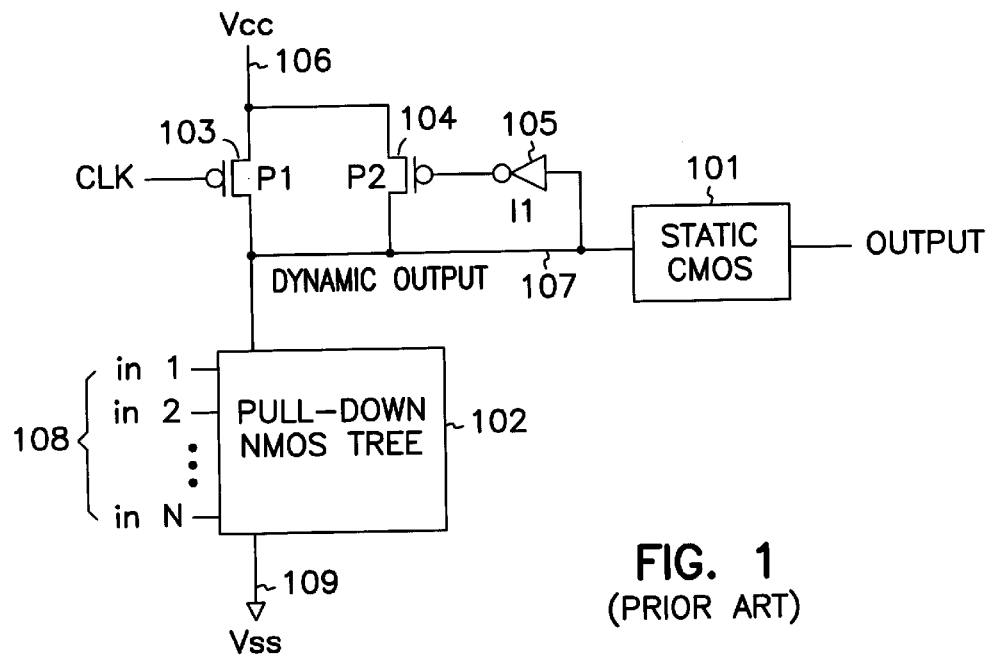
FIG. 1 shows a domino logic circuit, consistent with the prior art.

FIG. 1 illustrates a typical precharge circuit employed in prior art domino logic circuitry. The circuit consists essentially of three stages, including a static complementary metal-oxide semiconductor (CMOS) circuit 101, a dynamic precharge circuit, and a pull-down n-channel metal oxide semiconductor (NMOS) circuit 102. The dynamic precharge circuit, which is the focus of this invention, typically consists of a p-channel transistor 103 that is coupled to a clock signal at its gate, and a second p-channel transistor 104 that is coupled to an inverter 105 output at its gate. Both p-channel transistors 103 and 104 are connected between a high voltage connection 106 and a dynamic output node 107, and the input of the inverter 105 is further connected to the dynamic output node 107. The dynamic output node is connected to the static CMOS circuit 101, and to the pull-down NMOS tree 102. The pull down NMOS tree 102 is further connected to one or more inputs 1 through n shown at 108, and to a low voltage connection 109. In some embodiments, p-channel transistor 104 has a relatively small channel width or other feature to reduce the current conducted by the transistor.

In operation, the p-channel transistor 103 conducts when the clock signal is low, charging dynamic output node 107 to approximately the voltage level of the high voltage connection 106. This stage is known as the precharge stage or precharge phase, because the dynamic output node is charged to the voltage present at 106. When the clock signal goes high, the p-channel transistor 103 no longer conducts, and the voltage level at the dynamic output node 107 is maintained high by p-channel transistor 104.

Transistor 104 and inverter 105 form a level keeper portion of the circuit, and function to weakly maintain the present high or low voltage state of the dynamic output node 107 when the clock signal is high. Because the dynamic output node is at high voltage when the clock transitions from low to high, the dynamic output node high voltage signal is inverted by the inverter and turns the p-channel transistor 104 on, maintaining a connection between the high voltage connection 106 and the dynamic output node 107. P-channel transistor 104 is intentionally designed to be somewhat weak, or to have a low current when on, so that the dynamic output node can be driven to a low voltage level despite the level keeper.

The pull-down NMOS tree 102 implements the logic portion of the circuit, and is connected between the dynamic output node and the low voltage connection 109. The pull-down NMOS tree either connects or does not connect the dynamic output node to ground, depending on the desired logical output. If the pull-down NMOS tree is turned on and conducts between the low voltage connection 109 and the dynamic output node 107, the conduction to a low voltage level overcomes the high voltage connection via p-channel transistor 104 of the level keeper, forcing the dynamic output node to a low voltage state. The level keeper circuit then turns transistor 104 off, leaving the dynamic output node at a low voltage level.

After sufficient time has passed for the dynamic output node to change states from a high voltage level to a low voltage level, the dynamic output node signal provides a logical output signal representing the logic of the pull-down NMOS tree, and is input to a static CMOS circuit 101. The static CMOS circuit then provides a high or low voltage output, based on whether the dynamic output node 107 has a voltage level higher or lower than the threshold point of the static CMOS circuit.

The time needed for the static CMOS circuit to change state after the clock signal transitions high is dependent on the time needed to pull the dynamic output node 107 down from its high voltage level to a voltage level below the threshold point Vx of the static CMOS circuit. In this circuit, the voltage swing must therefore be Vcc-Vx, or the high voltage connection voltage level minus the threshold voltage of the static CMOS circuit. The voltage threshold Vx is typically Vcc/2, meaning a voltage swing of one-half Vcc is necessary to change states. The present invention, as illustrated in one embodiment in FIG. 2, provides a domino logic circuit that requires a reduced voltage swing to change states and therefore increases the operating speed of a domino logic circuit.

Figure 2:
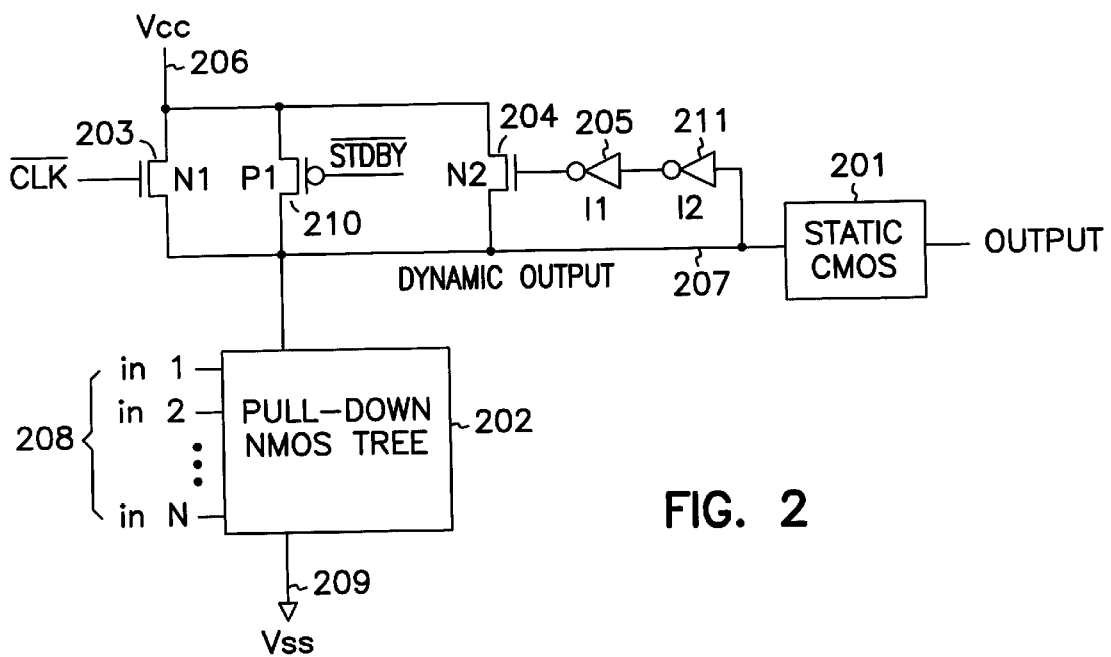
FIG. 2 shows an NMOS precharge domino logic circuit, consistent with an embodiment of the present invention.

FIG. 2 illustrates an embodiment of the inventive domino logic circuit that provides a reduced voltage swing at the dynamic output node to change states. Static CMOS circuit 201 and pull-down NMOS tree 202 are essentially similar to and perform the same function as the corresponding elements in the circuit shown in FIG. 1, but the precharge circuit differs substantially. An inverted clock signal is provided to an n-channel transistor 203, which conducts current when the inverted clock signal is high. The transistor 203 links the dynamic output node 207 to the high voltage connection 206, and therefore charges the dynamic output node to a high voltage level when conducting. When the inverted clock signal goes low, the level keeper circuit comprising n-channel transistor 204 and inverters 205 and 211 maintain a weakly held high voltage level at dynamic output node 207.

The serially connected inverters 205 and 211 couple the transistor 204 to the dynamic output node via logic circuitry, such that the inverters provide a logical high or low signal to the transistor 204 depending on whether the varying voltage at the dynamic output node is above or below a threshold voltage of the inverter 211. The n-channel transistor, when on, conducts between the high voltage connection and the dynamic output node, weakly keeping the dynamic output node at a high voltage level, as long as the dynamic output node voltage does not drop below the threshold voltage of the inverter 211. The pull-down NMOS tree 202 again conducts between the dynamic output node and low voltage connection 209, depending on the logic implemented in the tree and the state of logic inputs 208.

Finally, a standby p-channel transistor 210 in some embodiments conducts between the high voltage connection and the dynamic input node when the inverted standby signal is low, charging the dynamic output node to the high voltage connection voltage level. This prevents leakage current in the p-channel devices in the static CMOS circuit 201 due to a reduced voltage level at the dynamic output node. In a further embodiment of the invention, the clock signal is frozen when the circuit is in standby mode, to avoid unnecessary power dissipation in the heavily distributed clocks of typical domino logic circuits. This may be implemented in some embodiments by use of a NAND gate that receives both an inverted standby and a gate clock signal, and outputs an inverted clock signal to the domino logic circuit.

In operation, the n-channel transistor 204 charges the dynamic output node to a voltage level of Vcc-Vt, where Vt is the threshold voltage of the n-channel transistor. Typical values in current circuits for these values are Vcc=1.5 V, and Vt=300 mV, yielding a 300 mV smaller voltage drop required to switch the dynamic output node state of the domino logic circuit in FIG. 2 as compared to the circuit shown in FIG. 1. Because the threshold voltage for such static CMOS circuitry to change state Vx is typically Vcc/2, or approximately 750 mV, the voltage drop required to switch states in the circuit of FIG. 2 is Vcc-Vt-Vx, or 450 mV. This voltage drop is substantially smaller than the voltage drop required to switch states of the circuit of FIG. 1, which is Vcc-Vx, or approximately 750 mV using typical circuit fabrication and design techniques.

The dynamic energy needed to switch circuit states is dependent on the capacitance of the dynamic circuit node, which is termed Cdyn. The switching energy required for each transition of the dynamic circuit is then $CdynVcc^2$ for the circuit of FIG. 1, compared to a lower CdynVcc(Vcc-Vt) for the circuit of FIG. 2. Therefore, the energy needed for a transition is reduced by approximately 20 percent, or by a factor of (Vcc-Vt)/Vcc. The inventive circuit therefore reduces not only time required to change states, but energy needed to change states in domino logic circuitry.

Figure 3:
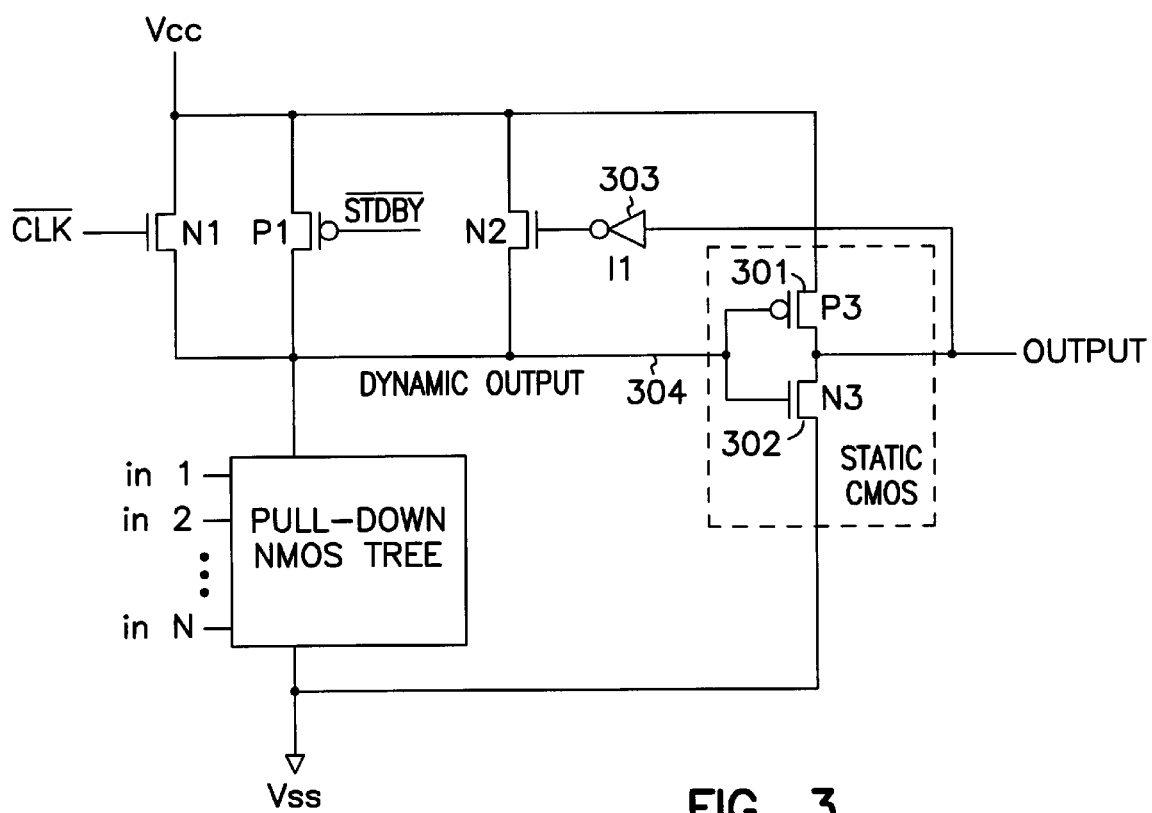
FIG. 3 shows an NMOS precharge domino logic circuit with an output inverter, consistent with an embodiment of the present invention.

A further embodiment of the invention is shown in FIG. 3, which shows the circuit of FIG. 2 modified to use an inverter as the static CMOS circuit 201. Because the circuit of FIG. 2 employs two inverters 205 and 211, the circuit of FIG. 3 can simply be viewed as the circuit of FIG. 2 with the static CMOS output connected between inverters 205 and 211. In FIG. 3, the inverter 211 from FIG. 1 is shown as p-channel transistor 301 and n-channel transistor 302 controlled by the dynamic output node 304, such that the output from the inverter provides both a circuit output and an input to inverter I1 at 303. This eliminates the need for a further static CMOS circuit to convert the varying voltage levels of the dynamic output node to a switched logic signal.

The present invention provides an improvement over a traditional domino logic precharge circuit, and further provides a class of domino logic circuitry that provides power savings and faster operation relative to traditional domino logic circuits. The embodiments of the present invention shown in figures two and three are examples of how the invention may be practiced, but are not meant to define the invention. The invention extends to include adaptations of the circuit shown, within the scope of the appended claims. For example, the invention may be implemented by discrete components or as a part of an integrated circuit, including integrated circuits comprising not only domino logic circuitry but that include a variety of other circuitry.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:
1. A circuit, comprising:
   an n-channel clock transistor coupled between a dynamic output node and a first supply voltage, a gate of the n-channel clock transistor coupled to receive an inverse clock signal;
   a first inverter and a second inverter connected in series, an input of the first inverter connected to an output of the second inverter, and an input of the second inverter connected to the dynamic output node;
   an n-channel level keeper transistor coupled between the dynamic output node and the first supply voltage, a gate of the n-channel level keeper transistor coupled to the output of the first inverter;
   a pull-down circuit connected between the dynamic output node and a second supply voltage; and
   a p-channel standby transistor coupled between the first voltage supply and the dynamic output node, a gate of the p-channel standby transistor coupled to receive an inverse standby signal.
2. The circuit of claim 1, wherein the pull-down circuit is a pull-down NMOS tree.
3. The circuit of claim 1, further comprising:
   a static CMOS circuit, an input of which is connected to the dynamic output and an output of which provides an output signal.
4. The circuit of claim 3, wherein the static CMOS circuit comprises an inverter.
5. An integrated circuit, comprising:
   a first input connection for receiving a clock signal;
   a second input connection for receiving an input data signal; and
   a domino logic circuit coupled to receive the input clock signal and the data signal, the domino logic circuit including a dynamic stage having an n-channel transistor coupled between a first voltage supply and a dynamic output node and a gate of the transistor coupled to the dynamic output node, and further comprising a p-channel standby transistor coupled between the first voltage supply and the dynamic output node, and a gate of the p-channel standby transistor coupled to receive an inverse standby signal.
6. The integrated circuit of claim 5, wherein the domino logic circuit further comprises a second n-channel transistor coupled between the first voltage supply and the dynamic output node, and where the gate of the second n-channel transistor is coupled to receive an inverse clock signal.
7. The integrated circuit of claim 5, wherein the logical coupling between the gate of the n-channel transistor and the dynamic output node is implemented via two inverters connected in series.
8. The integrated circuit of claim 5, further comprising a pull-down circuit coupled between the dynamic output node and a second voltage supply, such that the pull-down circuit is coupled to receive an input data signal.
9. The integrated circuit of claim 8, wherein the pull-down circuit is a pull-down NMOS tree.
10. The integrated circuit of claim 5, further comprising:
    a static CMOS circuit, an input of which is connected to the dynamic output node and an output of which provides an output signal.
11. The integrated circuit of claim 10, wherein the static CMOS circuit comprises an inverter.
12. A processor integrated circuit, comprising a domino logic circuit coupled to receive an input clock signal and a data signal, the domino logic circuit including a dynamic stage having an n-channel transistor coupled between a first voltage supply and a dynamic output node and a gate of the transistor coupled to the dynamic output node, and further comprising a p-channel standby transistor coupled between the first voltage supply and the dynamic output node, and a gate of the p-channel standby transistor coupled to receive an inverse standby signal.
13. A method of operating a domino logic circuit, comprising:
    receiving an inverse clock signal via a first n-channel transistor coupled between a first voltage supply and a dynamic output node;
    charging the dynamic output node of the domino logic circuit via the first n-channel transistor when the inverse clock signal is high;
    receiving an input data signal via a pull-down circuit connected between the dynamic output node and a second voltage supply;
    evaluating the input data signal by selectively coupling the dynamic output node to the second voltage source in response to the input data signal when the inverse clock signal is low; and
    evaluating the state of a p-channel standby transistor coupled between the first voltage supply and the dynamic output node, a gate of the p-channel standby transistor coupled to receive an inverse standby signal, such that when the inverse standby signal is low the dynamic output node is held at the first voltage supply level.
14. The method of claim 13, further comprising selectively overcoming a weakly-held dynamic output node voltage held by a second n-channel transistor coupled between the dynamic output node and the first voltage supply, with a gate of the second n-channel transistor coupled to the dynamic output node, as a result of selectively coupling the dynamic output node to the second voltage source.
15. A circuit, comprising:
    an n-channel clock transistor coupled between a dynamic output node and a first supply voltage, a gate of the n-channel clock transistor coupled to receive an inverse clock signal;
    a first inverter and a second inverter connected in series, an input of the first inverter connected to an output of the second inverter, and an input of the second inverter connected to the dynamic output node;
    an n-channel level keeper transistor coupled between the dynamic output node and the first supply voltage, the gate of the n-channel level keeper transistor coupled to the output of the first inverter;
    a pull-down circuit connected between the dynamic output node and a second supply voltage;
    a static CMOS circuit, an input of which is connected to the dynamic output and an output of which provides an output signal; and
    a p-channel transistor coupled between the first voltage supply and the dynamic output node, a gate of the p-channel standby transistor coupled to receive an inverse standby signal.

16. A circuit, comprising:

an n-channel clock transistor coupled between a dynamic output node and a first supply voltage, a gate of the n-channel clock transistor coupled to receive an inverse clock signal;

a first inverter and a second inverter connected in series, an input of the first inverter connected to an output of the second inverter, and an input of the second inverter connected to the dynamic output node, and the output of the second inverter providing a logic circuit output signal;

an n-channel level keeper transistor coupled between the dynamic output node and the first supply voltage, the gate of the n-channel level keeper transistor coupled to the output of the first inverter;

a pull-down circuit connected between the dynamic output node and a second supply voltage; and a p-channel transistor coupled between the first voltage supply and the dynamic output node, a gate of the p-channel standby transistor coupled to receive an inverse standby signal.

* * * * *